United States Patent
Olgaard et al.

(10) Patent No.: US 11,032,725 B1
(45) Date of Patent: Jun. 8, 2021

(54) SYSTEM AND METHOD FOR TESTING DATA PACKET SIGNAL TRANSCEIVERS WITH A TESTER USING EXTERNALLY INITIATED AND SELF-TERMINATING TEST CONTROL SEQUENCES

(71) Applicant: LitePoint Corporation, San Jose, CA (US)

(72) Inventors: Christian Volf Olgaard, Saratoga, CA (US); Ruizu Wang, Santa Clara, CA (US); Chen Cao, Sunnyvale, CA (US)

(73) Assignee: LITEPOINT CORPORATION, San Jose, CA (US)

( * ) Notice: Subject to any disclaimer, the term of this patent is extended or adjusted under 35 U.S.C. 154(b) by 0 days.

(21) Appl. No.: 16/822,523

(22) Filed: Mar. 18, 2020

(51) Int. Cl.
| | |
|---|---|
| *H04W 24/04* | (2009.01) |
| *H04W 24/06* | (2009.01) |
| *H04B 17/29* | (2015.01) |
| *G01R 31/302* | (2006.01) |
| *G01R 31/319* | (2006.01) |

(52) U.S. Cl.
CPC ........ *H04W 24/06* (2013.01); *G01R 31/3025* (2013.01); *G01R 31/319* (2013.01); *H04B 17/29* (2015.01); *H04W 24/04* (2013.01)

(58) Field of Classification Search
CPC ...... H04W 24/06; H04W 24/04; H04B 17/29; G01R 31/3025; G01R 31/319
See application file for complete search history.

(56) References Cited

U.S. PATENT DOCUMENTS

| | | | | |
|---|---|---|---|---|
| 5,402,427 | A * | 3/1995 | Parker .............. | G01R 31/31921 324/73.1 |
| 5,592,099 | A * | 1/1997 | Kuribara .............. | G01R 31/303 324/754.21 |
| 6,164,116 | A * | 12/2000 | Rice .................... | G01M 3/2876 73/1.72 |
| 8,378,707 | B2 * | 2/2013 | Rivoir .............. | G01R 31/31932 324/762.01 |
| 10,181,915 | B1 * | 1/2019 | Slamani ................. | H04B 17/29 |
| 2002/0171448 | A1 * | 11/2002 | Takeuchi ............... | G11C 29/56 324/762.01 |
| 2003/0135343 | A1 * | 7/2003 | Samuelson ........ | G01R 31/2841 702/117 |
| 2005/0135814 | A1 * | 6/2005 | Courtney ............... | H04B 10/07 398/147 |
| 2005/0267696 | A1 * | 12/2005 | Yamaguchi ...... | G01R 31/31709 702/57 |
| 2006/0123306 | A1 * | 6/2006 | Whetsel ................. | G06F 13/40 714/744 |
| 2008/0320345 | A1 * | 12/2008 | Olgaard ................ | H04W 24/06 714/712 |
| 2013/0084853 | A1 * | 4/2013 | Mineda ................. | H04W 24/06 455/425 |

(Continued)

*Primary Examiner* — Dominic E Rego
(74) *Attorney, Agent, or Firm* — Mark Dalla Valle; Rosenbaum IP

(57) ABSTRACT

System and method for testing a wireless data packet signal transceiver device under test (DUT) in which external control circuitry manages initiation of execution by a tester of test program instructions defining multiple self-terminating test control sequences in one or more desired sequences. The test control sequences may be pre-stored in a tester for subsequent execution under control of control signals sourced externally by the external control circuitry via separate control signals.

18 Claims, 5 Drawing Sheets

(56) References Cited

U.S. PATENT DOCUMENTS

| | | | |
|---|---|---|---|
| 2013/0183898 A1* | 7/2013 | Strid | H02J 50/05 455/41.1 |
| 2013/0200931 A1* | 8/2013 | Kono | H03H 11/16 327/150 |
| 2014/0006868 A1* | 1/2014 | Grey | G06F 11/2273 714/33 |
| 2014/0223249 A1* | 8/2014 | Dodeja | G01R 31/3177 714/727 |
| 2015/0137839 A1* | 5/2015 | Jones | G01R 31/00 324/750.01 |

* cited by examiner

SYSTEM AND METHOD FOR TESTING DATA PACKET SIGNAL TRANSCEIVERS WITH A TESTER USING EXTERNALLY INITIATED AND SELF-TERMINATING TEST CONTROL SEQUENCES

BACKGROUND

The present invention relates to testing a radio frequency (RF) data packet transceiver device under test (DUT), and in particular, to use of testers operating in accordance with concatenated test control sequences that may be stored internally and individually initiated by externally sourced trigger signals, and are self-terminating.

Many of today's electronic devices use wireless signal technologies for both connectivity and communications purposes. Because wireless devices transmit and receive electromagnetic energy, and because two or more wireless devices have the potential of interfering with the operations of one another by virtue of their signal frequencies and power spectral densities, these devices and their wireless signal technologies must adhere to various wireless signal technology standard specifications.

When designing such wireless devices, engineers take extra care to ensure that such devices will meet or exceed each of their included wireless signal technology prescribed standard-based specifications. Furthermore, when these devices are later being manufactured in quantity, they are tested to ensure that manufacturing defects will not cause improper operation, including their adherence to the included wireless signal technology standard-based specifications.

Testing of such wireless devices typically involves testing of the receiving and transmitting subsystems of the device under test (DUT). The testing system will send a prescribed sequence of test data packet signals to a DUT, e.g., using different frequencies, power levels, and/or signal modulation techniques to determine if the DUT receiving subsystem is operating properly. Similarly, the DUT will send test data packet signals at a variety of frequencies, power levels, and/or modulation techniques for reception and processing by the testing system to determine if the DUT transmitting subsystem is operating properly.

For testing these devices following their manufacture and assembly, current wireless device test systems typically employ testing systems having various subsystems for providing test signals to each device under test (DUT) and analyzing signals received from each DUT. Some systems (often referred to as "testers") include, at least, one or more sources of test signals (e.g., in the form of a vector signal generator, or "VSG") for providing the source signals to be transmitted to the DUT, and one or more receivers (e.g., in the form of a vector signal analyzer, or "VSA") for analyzing signals produced by the DUT. The production of test signals by the VSG and signal analysis performed by the VSA are generally programmable (e.g., through use of an internal programmable controller or an external programmable controller such as a personal computer) so as to allow each to be used for testing a variety of devices for adherence to a variety of wireless signal technology standards with differing frequency ranges, bandwidths and signal modulation characteristics.

As part of the manufacturing of wireless communication devices, one significant component of production cost is costs associated with manufacturing tests. Typically, there is a direct correlation between the cost of test and the sophistication of the test equipment required to perform the test. Thus, innovations that can preserve test accuracy while minimizing equipment costs (e.g., increasing costs due to increasing sophistication of necessary test equipment, or testers) are important and can provide significant costs savings, particularly in view of the large numbers of such devices being manufactured and tested.

Accordingly, it would be desirable to have techniques for testing increasingly sophisticated DUTs with increasingly varied performance characteristics and requirements without also requiring increasingly sophisticated testers with similarly increasingly varied testing characteristics and requirements. More particularly, it would be desirable to minimize required communications during testing between the tester and related external control systems and/or devices.

SUMMARY

A system and a method are provided for testing a wireless data packet signal transceiver device under test (DUT) in which external control circuitry manages initiation of execution by a tester of test program instructions defining multiple self-terminating test control sequences in one or more desired sequences. The test control sequences may be pre-stored in a tester for subsequent execution under control of control signals sourced externally by the external control circuitry via separate control signals.

In accordance with an exemplary embodiment, a system for testing a radio frequency (RF) data packet transceiver device under test (DUT) includes: a plurality of control signal ports; a controller coupled to the plurality of control signal ports and operative to initiate respective ones of a plurality of test control sequences, wherein each of the plurality of test control sequences includes a respective beginning operation and a respective ending operation, each beginning operation is initiated by an input signal received via a first port of the plurality of control signal ports from an external device, each ending operation initiates an output signal provided for the external device via a second port of the plurality of control signal ports, and the controller executes a beginning operation of one of the plurality of test control sequences following the input signal received via the first port after an ending operation of a preceding one of the plurality of test control sequences; a RF data packet transmitter coupled to the controller and responsive to one or more portions of the plurality of test control sequences by transmitting one or more RF data packet signals for reception by a DUT; and a RF data packet receiver coupled to the controller and responsive to one or more portions of the plurality of test control sequences by receiving one or more RF data packet signals provided by the DUT.

In accordance with another exemplary embodiment, a computing device for controlling a tester during testing of a radio frequency (RF) data packet transceiver device under test (DUT) includes: a first control signal port for providing a first control signal for reception by a tester; a second control signal port for receiving a second control signal provided by the tester; a third control signal port for providing a third control signal for reception by a DUT; a fourth control signal port for receiving a second control signal provided by the DUT; one or more processors coupled to the first, second, third and fourth control signal ports; and a first memory portion coupled to the one or more processors and containing a plurality of instructions that when executed cause the one or more processors to generate the first control signal to initiate, by the tester, a first beginning operation of a first one of a plurality of test control sequences, respond to the second control signal by generating another first control signal to initiate, by the tester, a second beginning operation of a second one of the plurality of test control sequences, generate the third control signal to initiate, by the DUT during at least a portion of the first one of a plurality of test control sequences, transmission of a first one or more outgoing RF data packet signals and reception of a first one or more incoming RF data packet signals, and respond to the fourth control signal by generating another third control signal to initiate, by the DUT, during at least a portion of the second one of a plurality of test control sequences, transmission of a second one or more outgoing RF data packet signals and reception of a second one or more incoming RF data packet signals.

In accordance with another exemplary embodiment, a method for testing a radio frequency (RF) data packet transceiver device under test (DUT) includes: receiving an input signal via a first port of a plurality of control signal ports; providing an output signal via a second port of the plurality of control signal ports; initiating respective ones of a plurality of test control sequences, wherein each of the plurality of test control sequences includes a respective beginning operation and a respective ending operation, each beginning operation is initiated by the input signal, each ending operation initiates the output signal, and a beginning operation of one of the plurality of test control sequences is executed following the input signal received via the first port after an ending operation of a preceding one of the plurality of test control sequences; responding to one or more portions of the plurality of test control sequences by transmitting one or more RF data packet signals for reception by a DUT; and responding to one or more portions of the plurality of test control sequences by receiving one or more RF data packet signals provided by the DUT.

DETAILED DESCRIPTION

Figure 1:
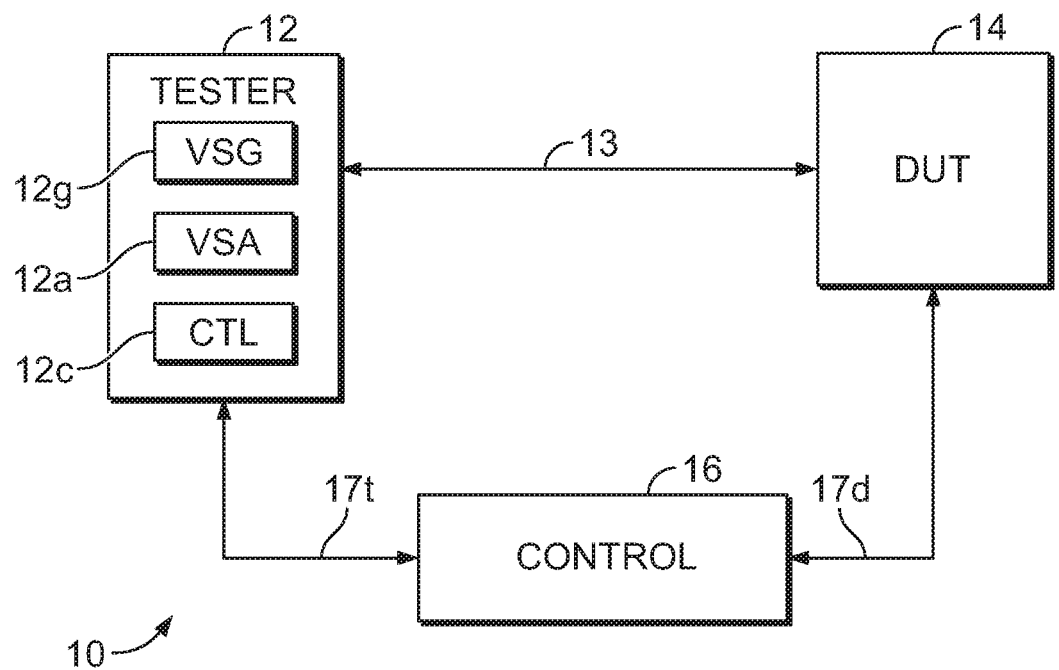
FIG. 1 depicts a conventional test environment for testing data packet transceivers.

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed. Moreover, to the extent that the figures illustrate diagrams of the functional blocks of various embodiments, the functional blocks are not necessarily indicative of the division between hardware circuitry.

For example, acts, modules, logic and method steps discussed herein may take the form of a computer program or software code stored in a tangible machine-readable medium or media (e.g., memory or storage media operating in accordance with electronic and/or magnetic principles) in communication with a control unit, comprising a processor and memory, which executes the code to perform the described behavior, function, features and methods. It will be recognized by one of ordinary skill in the art that these operations, structural devices, acts, logic, method steps and modules may be implemented in software, in firmware, in special purpose digital logic, and any combination thereof without deviating from the spirit and scope of the present invention as recited within the claims.

Wireless devices, such as cellphones, smartphones, tablets, etc., make use of standards-based technologies, such as IEEE 802.11a/b/g/n/ac ("WiFi"), 3GPP LTE, Bluetooth, Zigbee, Z-Wave, etc. The standards that underlie these technologies are designed to provide reliable wireless connectivity and/or communications. The standards prescribe physical and higher-level specifications generally designed to be energy-efficient and to minimize interference among devices using the same or other technologies that are adjacent to or share the wireless spectrum.

Tests prescribed by these standards are meant to ensure that such devices are designed to conform to the standard-prescribed specifications, and that manufactured devices continue to conform to those prescribed specifications. Most devices are transceivers, containing at least one or more receivers and one or more transmitters. Thus, the tests are intended to confirm whether the receivers and transmitters both conform. Tests of the receiver(s) of the DUT (RX tests) typically involve a test system (tester) sending test packets to the receiver(s) and some way of determining how the DUT receiver(s) respond to those test packets. Tests of the transmitter(s) of the DUT (TX tests) are performed by having them send packets to the test system, which may then evaluate various physical characteristics of the signals from the DUT.

Testing of wireless devices, such as WiFi, Bluetooth, Zigbee and Z-Wave devices, has progressed from frequent two-way messaging between a tester and DUT to infrequent messaging between which major portions of test flows are executed within and coordinated between tester and DUT using non-link test solutions where only the unique device identifier and portions of the PHY are active. However, results of such tests would typically have been conveyed from DUT to tester via communications ports and pathways as the upper level of the protocol stack is not active, thereby preventing data from being easily conveyed in the transmitted packets. Therefore, where the only connection between a DUT and tester is either conducted or radiated signal paths and the data exchanged is via data packets, it may be difficult, if possible at all, for a DUT to convey test results to a tester using non-link test methods. As discussed in more detail below, in accordance with exemplary embodiments of the presently claimed invention, testing of a RF data packet transceiver can be performed, at least in part, by testing at lower layers of the network data packet signal communications protocol.

As discussed in more detail below, in accordance with related embodiments, interactions between a tester and a DUT can be controlled in such a way as to reduce latency and necessary volume of communications between the tester and the DUT, thereby reducing test time and, therefore, costs associated with test time. For example, communications latency can be reduced by enabling the tester to more rapidly transition between signal transmission and signal reception modes of operation, while communications volume can be minimized by reducing the number of control commands needed to flow from the tester to the DUT.

One technique for minimizing interaction between a tester and DUT involves using a single command from the tester to initiate transaction of multiple, predetermined tester data packets until a predetermined number of such tester data packets have been transmitted. (This has been disclosed in detail in U.S. Pat. Nos. 7,484,146, 7,567,521 and 7,962,823, the contents of which are incorporated herein by reference.) Another technique involves using a predetermined sequence of test steps known to both the DUT and the tester to reduce the need for commands to be exchanged between the DUT and tester. (This has been disclosed in detail in U.S. Pat. Nos. 7,689,213, 7,865,147, 8,131,223 and 8,676,188, the contents of which are incorporated herein by reference.) However, these sequencing techniques involving multiple tester data packets and sequencing of test steps require support on the part of the tester or DUT, or both, such as additional hardware, firmware or software (e.g., additional programming of test commands). For example, to support these time saving test techniques, the DUT might require firmware that is specific to its processing subsystem (e.g., its particular chipset), and one or more manufacturers of the integrated circuits may be required to support these techniques with specific driver functions.

These difficulties, however, can be avoided with the presently claimed invention, which enables multiple test data packet and test step sequencing techniques to be used without requiring special provisions to the DUT, and in most cases, to the tester as well. In accordance with exemplary embodiments, an external processing subsystem is used to control the DUT in coordination with the tester. This external subsystem can be designed to accommodate a variety of DUTs and their associated chipsets to support multiple test data packet and test step sequencing techniques, while requiring no modifications to the hardware or firmware of the DUT.

Referring to FIG. 1, a conventional testing environment for testing a wireless data packet transceiver device under test (DUT) includes the tester 12, a DUT 14 (or, alternatively, multiple DUTs to be tested concurrently or sequentially, depending upon the tester configuration), and a controller 16 (e.g., a personal computer). As discussed above, a tester includes a data packet signal source 12g (typically in the form of a VSG) and a data packet signal receiver and analyzer 12a (typically in the form of a VSA). The tester can also include control circuitry 12c for performing various control functions in accordance with internally stored test programs or test commands or programs received from an external source (e.g., the controller 16).

The tester 12 and DUT 14 communicate via a signal path 13. This signal path 13 is typically in the form of a conductive radio frequency (RF) signal path, such as a coaxial cable and connectors. However, this signal path 13 can also be in the form of a radiative signal path, such as that formed by the use of RF antennas (not shown) connected to the signal ports of the tester 12 and DUT 14 for radiating and receiving electromagnetic signals in accordance with well-known principles.

The controller 16 provides testing instructions and receives test data from the tester 12 and DUT 14 via signal interfaces 17t, 17d, which are typically in the form of multiple-conductor cables.

As discussed above, such a testing environment can support sequencing of multiple test packets and test steps. However, as also discussed above, such support is achieved at the cost of modifications to hardware or firmware of at least the DUT 14, and, in some cases, to the tester 12 as well.

Figure 2:
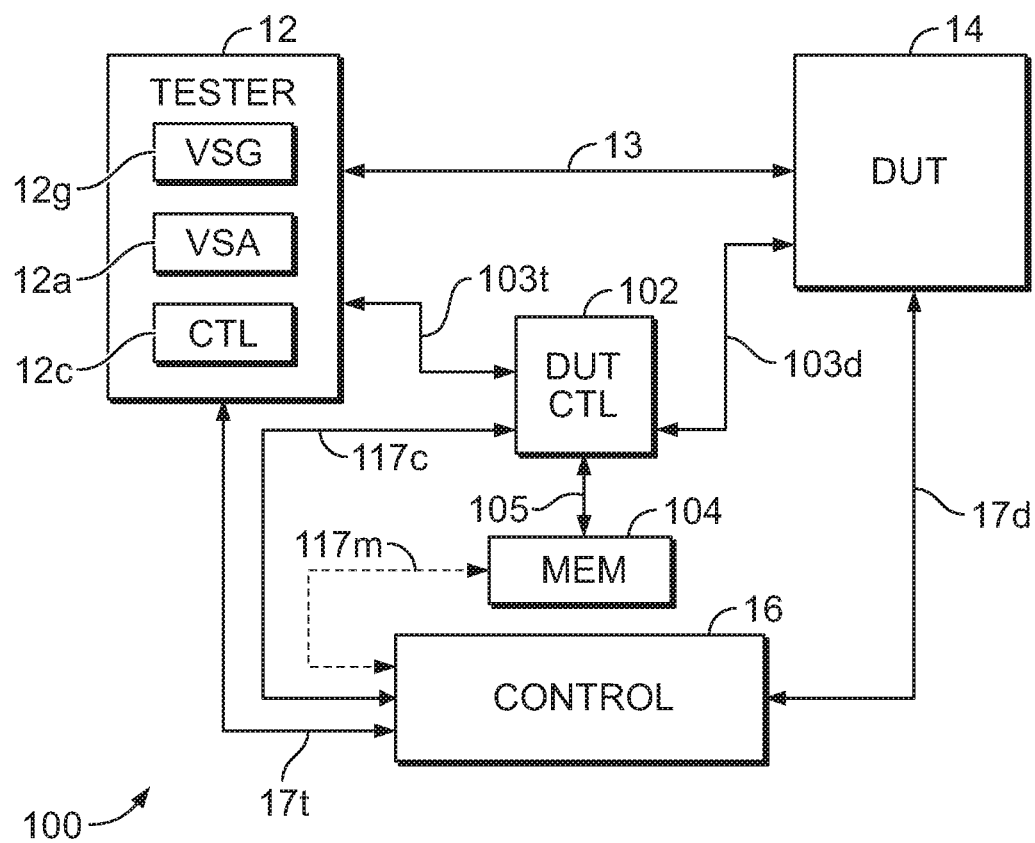
FIG. 2 depicts a test environment for testing data packet transceivers in accordance with related embodiments.

Referring to FIG. 2, a testing environment 100 in accordance with related embodiments includes an external subsystem 102, 104, which, as discussed above, operates in coordination with the tester 12 and includes any necessary hardware, firmware or software needed to support multiple test data packet and test step sequencing of the DUT 14 in accordance with the requirements of the DUT 14 chipset.

When testing the DUT 14, the tester 12 sends data packet signals to the DUT 14 via the signal path 13, and monitors responses received from the DUT 14, e.g., in the form of acknowledgment signals ("ACK") or other types of data packet signals. For example, in a WiFi signal environment, responsive signals are received by the tester receiver circuitry 12a and analyzed, such as by measuring and comparing various physical signal characteristics (e.g., signal power, frequency, modulation type or bit-rate) against values specified in accordance with the signal standard in conformance with which the DUT 14 is designed to operate. Alternatively, in a frequency division duplex (FDD) signal environment (e.g., cellular telephone communications), response signals may not be necessary for analyses of received (by the DUT) signals. Such systems are designed and tested to ensure that the transmitter transmits with a signal power sufficient for reliable communications while not being so high as to interfere with reception by the receiver. Accordingly, the block error rate (BLER) and/or packet error rate (PER) may be extracted from the DUT.

During such testing, coordination between the tester 12 and DUT 14 is necessary, and is typically done by issuing commands to the DUT 14 from the tester 12 (e.g., via the data packet signal interface 13) or in coordination with the tester 12, such as by providing instructions to the DUT 14 from the controller 16 via the control signal interface 17d. Accordingly, during a complete test sequence, numerous control commands will be required to be conveyed from the tester 12 or controller 16 to the DUT 14 during one or more time intervals in which no test measurements are performed by the tester 12 (with respect to data packet signals received from the DUT 14) but which nonetheless consume time. Hence, overall test time can be reduced if these times needed for control commands can be reduced in duration and/or number.

In general, reducing the number of control commands requires that one or more commands cover more than one testing event. For example, a typical command to the DUT 14 to prepare to receive a test data packet signal from the tester 12 covers one event, i.e., the sending of the test signal. A second command to query the DUT 14 as to whether the test signal was received correctly or not also covers one event. However, if the DUT 14 was pre-programmed to respond to a single command by receiving a predefined number of test data packets from the tester 12, and automatically confirming that such test data packets were correctly received, that single original command could cover a potentially extensive sequence of testing events.

As a further example, if the DUT 14 and tester 12 operated in accordance with a previously agreed upon sequence of test steps to execute and, upon synchronization, began executing those test steps until all test steps were completed, or one test step had timed out, then that initial exchange of synchronization signals could cover an entire testing sequence, including both receive (RX) and transmit (TX) testing (from the perspective of the DUT 14) with test signals having predetermined physical characteristics (e.g., frequency, power, modulation type, bit-rate, etc.). Alternatively, the tester 12 and DUT 14 can transmit or receive data packets to or from one another, respectively, until a control or responsive signal is received by the transmitting unit from the receiving unit indicating completion of that set of test steps and signaling that the transmitting unit can proceed to the next predefined operation.

Further alternatively, the transmit and receive operations of the tester 12 and DUT 14 may be based on time. For example, during a first time interval (e.g., 30 ms) the DUT 14 may transmit data packets, followed by a second time interval (e.g., 40 ms) during which the DUT 14 receives data packets, followed by a third time interval (e.g., 30 ms) during which the DUT 14 again receives data packets but with a different reception bandwidth), followed by a fourth time interval (e.g., 50 ms) during which the DUT 14 again transmits data packets, and so on, throughout which the tester 12 adapts (e.g., synchronizes) its complementary transmit and receive operations to the timing of the DUT 14.

In accordance with related embodiments, the external subsystem 102 is provided (e.g., programmed) with programs specifically matched to the DUT 14 and its chipsets, thereby ensuring that the specific characteristics and capabilities of the DUT 14 can be tested adequately using time-saving testing techniques such as multiple test data packet and test step sequencing techniques. This advantageously avoids the need for special preparation or customization of the DUT 14, such as through expanded or customized hardware, firmware or modified or additional driver software. Accordingly, working in conjunction with the tester 12, it is this external processing subsystem 102 (e.g., a microcontroller), rather than the DUT 14, that is aware of and tasked with managing access to and execution of the test sequencing requirements.

The DUT controller 102 communicates (e.g., by exchanging control signals acting as triggers or containing instructions or data) with the tester 12 via a control signal interface 103t. Similarly, the DUT controller 102 communicates (e.g., by exchanging instructions and data) with the DUT 14 via another control signal interface 103d. The instructions for the programs needed to control the DUT 14 during testing can be stored internally or externally in separate memory circuitry 104, accessible via a memory interface 105. These programs (e.g., DUT control instructions and signal parameter values) can be pre-programmed into the DUT controller 102 or memory 104, or can be provided by the tester 12 (e.g., from the tester controller 12c), or provided by the external controller 16 directly to the memory 104 via another memory interface 117m.

Initiation of the testing of the DUT 14 normally begins with the tester 12 instructing the DUT controller 102 to configure the DUT 14 for the testing sequence to be performed. In response, the DUT controller 102 accesses the appropriate program and provides the instructions and parameter data needed for such tests. Alternatively, the external controller 16 can instruct the DUT controller 102, via a control interface 117c, to configure the DUT 14 for testing.

Following reception of a start signal from the tester 12 via its interface 103t, the DUT controller 102 instructs the DUT 14 to initiate a sequence of sending or receiving data packets until a predetermined number of data packets has been sent by the DUT 14, or until the tester 12 informs the DUT controller 102 that testing operations have been completed (e.g., the tester 12 has transmitted all data packets required for the current test). Alternatively, as noted above, the transmit and receive operations of the tester 12 and DUT 14 may be based on time in which the tester 12 adapts (e.g., synchronizes) its complementary transmit and receive operations to those of the DUT 14.

For example, in cases of a DUT TX signal measurement, the tester 12 would capture data packets transmitted from the DUT 14, and when the desired data packets have been captured by the tester 12 it would signal the DUT controller 102 to terminate data packet transmission by the DUT 14 and proceed to the next test Operation or, alternatively, start preparing the next sequence while the DUT completes the current sequence. Similarly, in the case of a DUT RX test, the tester 12 would signal the DUT 14, via the DUT controller 102, to begin receiving data packets via the signal path 13, and when the desired number of data packets have been transmitted by the tester 12 to the DUT 14, the tester 12 can instruct the DUT controller 102 to proceed to the next DUT test operation. Additionally, as needed, the DUT controller 102 can signal its readiness to the tester 12 via their signal interface 103t. Hence, as can be seen by these examples, multiple data packets can be transmitted and received by the tester 12 and DUT 14 with a single command from the external controller 16 and a start signal from the tester 12. As a result, communication and test flow control from the external controller 16 can be avoided and the tester 12 can control the flow of test operations based on pre-programmed test programs stored within and executed by the dedicated DUT controller 102.

Figure 3:
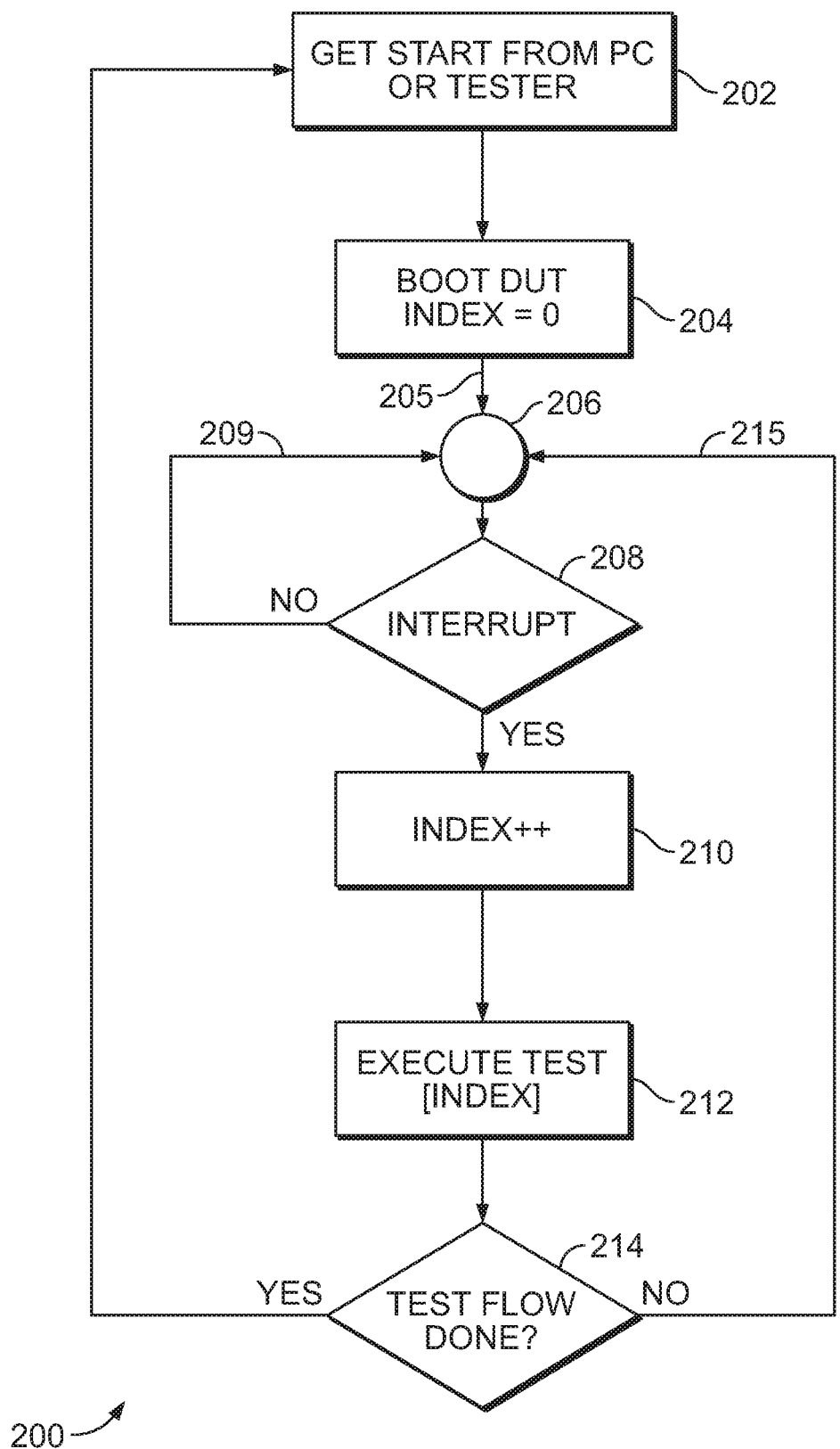
FIG. 3 depicts a test program flow in accordance with related embodiments.

Referring to FIG. 3, in accordance with a related embodiment, the program flow for testing using the environment of FIG. 2 can proceed as follows. Following a start command 202 from the external controller 16 or tester 12, the DUT controller 102 and DUT 14 are initialized, or "booted", 204. In the absence of the occurrence of an interrupt 209 (e.g., in the form of a command, request, or other type of signal from the tester 12), with the program index at zero, program flow 205 proceeds to determine whether or interrupt has occurred 208. If no interrupt has occurred 209, this step of checking for an interrupt 208 repeats until it is determined that an interrupt has occurred.

As will be appreciated by those skilled in the art, this actions may be performed by the tester since the DUT typically executes a single sequence followed by one or more additional single sequences, while the tester executes a single (e.g., longer) sequence that may pause between the different DUT sequences. This enables operation of the DUT as designed for its normal (e.g. post-production) operations, while only requiring test time and operations on the part of the DUT, for which the tester is ready. This may advantageously enable more efficient operation(s) by the tester since its test sequence are already prepared, thereby avoiding need for additional CPU cycles for its control and/or operation, as well as delay(s) due to on-going computations from one or more previous tests. Hence, while the tester may be programmed only once, it will nonetheless be capable of handling, with the same single tester sequence (or single series of tester sub-sequences), the multiple sequences of test operations programmed into the DUT.

Program flow then continues to the next step where the index is incremented 210, following which the next test command is executed 212 in accordance with the index value. Following this, it is determined whether the test flow has been completed 214. If not 215, the process of checking for interrupt 208, incrementing the index 210 and executing the next test command 212 is repeated. If test flow has been completed, then test flow reverts to the beginning, to await the next start command 202.

As a further alternative, the subsystem 102, 104 elements can be included as part of (e.g., internal to) the DUT 14. For example, the controller 102 and memory 104 can be elements within the DUT 14 that, while providing functionality for the DUT 14 during its normal use, also provide functionality specific for and dedicated to the testing operations as set forth above. Still further alternatives include testing environments in which the tester 12 issues multiple types of commands, and in which the DUT 14 transmits signals (e.g., either self-initiated or in response to signals from the tester 12).

As discussed in more detail below, latency and volume of communications between the tester and the DUT may be further reduced by improvements in how sequences are used in test scenarios. For example, preparing sequences in sequence test scenarios generally consume significant time with current testers. Running test sequences during a test flow requires extra overall test time, especially when using non-threaded code (e.g., as opposed to threaded code in which the programming code may consist primarily, or even entirely, of calls to subroutines). While it may be possible to cache sequences to reduce this additional overhead, test time will still be longer, and caching of sequences complicates the software.

As discussed in more detail below, in accordance with example embodiments, a single sequence may be constructed to include the entire test flow, e.g., by combining existing sequences in the test flow one after another (e.g., concatenated) with one or more external trigger events interposed between adjacent sequences (e.g., adjacent in terms of temporal execution, location(s) of sequences within the storage media, or memory pointer protocol used for accessing sequences within the storage media). For example, execution may begin with the first sequence in the test flow, which ends (e.g., self-terminates) to await reception of one or more external triggers, following which execution of the next sequence of the original flow proceeds, and so on.

Multiple benefits of this may be realized. Sequence caching is simplified since only one overall sequence will exist and may be repeated. No additional time is needed to prepare between sequences forming the overall test flow (e.g., only time for DUT control may be needed). Also, sequence loading is not delayed by high activity within the tester since the test sequence(s) will have already been loaded into and stored within the storage media, e.g., a field programmable gate array (FPGA). Accordingly, the tester will always be ready and waiting for its next trigger event. Hence, with sequence loading (into the tester) occurring when the DUT is booting up for the test (and, therefore, not active in terms of communications with the tester), a very parallel operation may be achieved.

One example of an advantageous operation will include having the tester send a trigger when a predetermined DUT sequence (e.g., as part of the test flow) is completed (e.g., the VSA completes capturing a DUT TX signal or the VSG completes transmission of a DUT RX signal). This trigger may inform external software (e.g., running within an external controller) to initiate the next DUT sequence, following which the external software may send a trigger back to the tester to signal completion. Alternatively, if the DUT execution command is a blocking call (e.g., a call to a function that causes a halting of continued program execution) the first trigger to external software may be eliminated.

While it may be possible to achieve similar performance using current trigger techniques based on DUT TX signals (e.g., with no dedicated triggers), the reverse operation in which triggers are based on DUT RX signals is not possible without the tester first learning somehow that the DUT is ready for responding to such a trigger. This would require some additional signal or communication, which will introduce an undesirable delay in the test operation. Using dedicated triggers advantageously avoid such delays.

In accordance with example embodiments, a board computer (e.g., a Raspberry Pi, which is a trademark of the Raspberry Pi Foundation) or similar may be used to generate and receive the trigger signals as well as to control the tester. For example, such a board computer or the like may be used to extract test results data from the tester and/or load the test sequence(s) into the tester. Off-loading such functionalities in this manner may enable more complex testing schemes or techniques to be more easily and efficiently implemented. Alternatively, a standard personal computer (PC) may be used generally in such manner as well, though a typical PC does not provide dedicated signal ports (e.g., for incoming and/or outgoing trigger signals), unlike a board computer.

Different ways to implement triggering events in such manner may be possible based on communications and/or other interactions between the tester and DUT. For example, if the DUT sequence includes a blocking call, it may be understood that the DUT is finished when the call returns and preparing the next DUT command(s) may be initiated. Depending upon whether the DUT is to trigger the tester or the tester is to trigger the DUT, the tester may be activated before or after the DUT by sending a trigger to initiate commencement of the next sequence within the tester (e.g., when the tester sequence is awaiting the trigger to resume operations).

On the other hand, if the DUT control includes a non-blocking call, the tester may send a trigger when its requisite operations are completed (e.g., the VSA completes capturing a DUT TX signal or the VSG completes transmission of a DUT RX signal). Such a trigger may be used to initiate preparation of the DUT and transmission by the DUT of another the trigger, depending upon whether the tester is to trigger the DUT or the DUT is to trigger the tester. Such trigger control and exchanges (possible combinations of which are discussed in more detail below) may be viewed as parts of a software interface handling the triggers between a tester and external trigger hardware (e.g., a board computer) in which external software execution initiates and controls the test flow.

Figure 4:
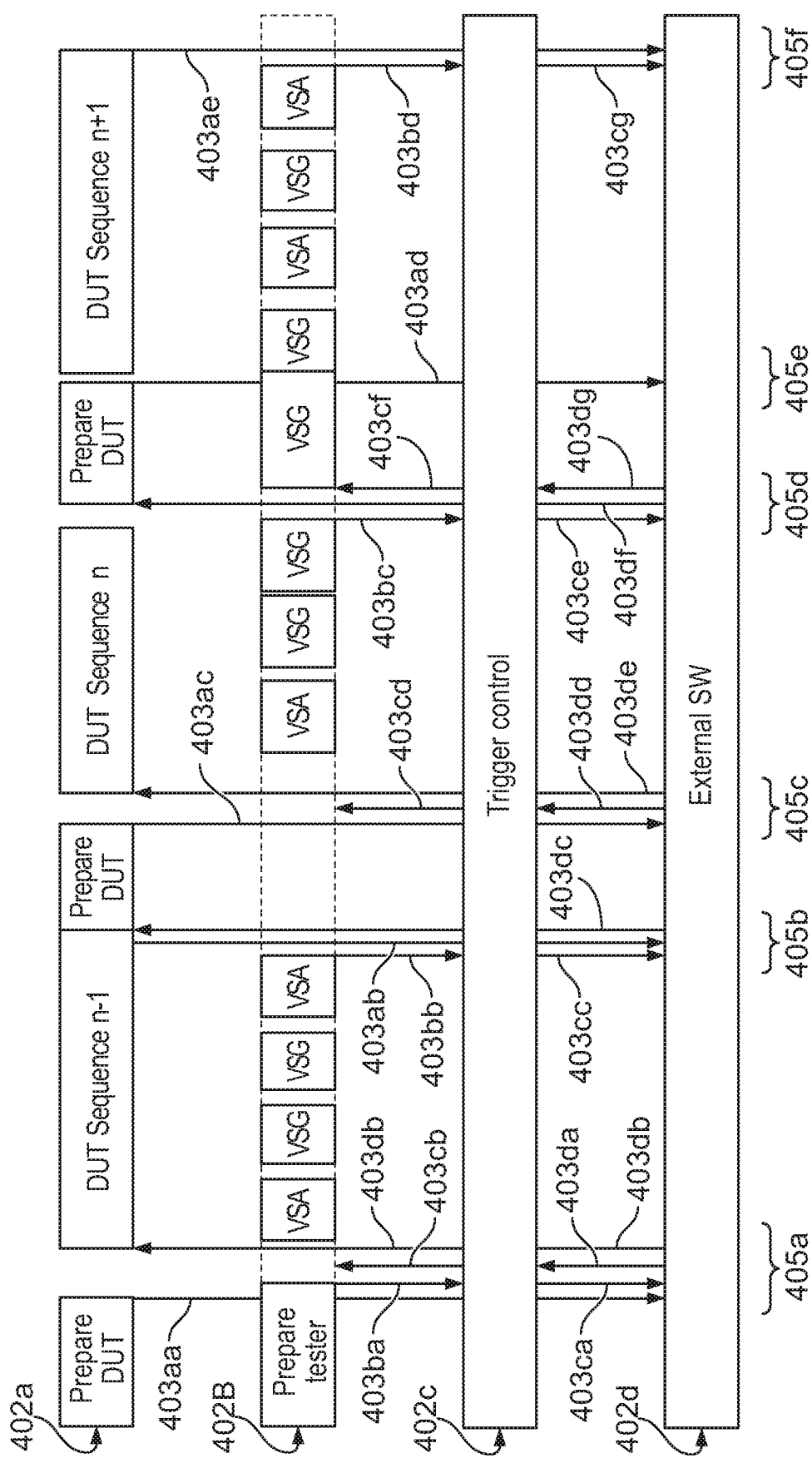
FIG. 4 depicts a test program flow in accordance with example embodiments.

Referring to FIG. 4, a test program flow in accordance with example embodiments is depicted in which, as discussed in more detail below, communications (e.g., trigger and/or status signals) 403 are exchanged among resources of the various test environment elements 402, which include a DUT 402a, a tester 402b, a trigger control source 402c (e.g., embodied as software executed with an external board computer having dedicated input and output ports), and external test control management 402d (e.g., embodied as software SW executed with an external computer such as a personal computer). The dedicated input and output ports on the external board computer may be implemented as general purpose input/output ("GPIO") ports, which are generally available as a type of pin found on an integrated circuit that does not have a specific function and may be customized and be controlled by software. Such GPIO pins may be found on single-board computers often designed for hobbyists and educational purposes (e.g., a Raspberry Pi™).

Following preparation of the DUT, a first portion 405a of a test sequence may include a series of communications 405a, e.g., beginning with the DUT 402a sending a signal 403aa to the external SW 402d to indicate its readiness for testing. Similarly, following preparation of the tester 402b it may send a signal 403ba to the trigger control source 402c. This advantageously establishes optimal system timing and may be implemented as the first part of the test sequence as soon as the sequence is ready. The next part of the sequence may await a signal trigger caused by the DUT 402a as it begins transmitting, or instead wait for another trigger to start and then begin looking for a DUT transmission. This trigger signal exchange may be used to avoid detecting a DUT signal transmission during DUT preparation (e.g., as during a DUT performing a self-calibration or similar operation). (Alternatively, if no DUT activity is to occur during its preparation, a trigger may be sent directly after the first hardware signal.) The trigger control source 402c may then send a signal 403ca to the test control management 402d to indicate readiness on the part of the tester 402b.

The test control management 402d may then send a signal 403da to the trigger control source 402c, which, in turn, may then send a corresponding signal 403cb to the tester 402b to initiate advancement of test operations to the next step in the sequence (this may be optional). Preferably, the tester 402b will already be ready for advancement of test operations prior to initiation of operations by the DUT 402a so as to enable the tester 402b to trigger on initial signal transmissions from the DUT 402a upon which timing within the tester 402b may be based. For example, this may be needed if compatibilities of the internal drivers of the DUT 402a are more compatible with or limited to interactions with a PC such as that hosting the test control management 402d, in which case the DUT 402a may not be sufficiently responsive to or otherwise compatible with the board computer hosting the trigger control source 402c.

The test control management 402d may then send a start signal 403db to the DUT 402a to alert the DUT 402a that it may then begin its test operations since the tester 402b is now ready to receive signal transmissions from the DUT 402a. This advantageously inhibits an initiation of test operations on the part of the tester 402b during intervals between operations by the DUT 402a. For example, this may ensure that the tester 402b does not erroneously trigger during DUT preparation (e.g., as during a DUT performing a self-calibration or similar operation), as well as allow timing to be reset and then started following DUT preparation to prevent the tester 402b from triggering on non-deterministic timing related to DUT preparation.

A second portion 405b of a test sequence may include a series of communications, e.g., following the last capture by the tester needed in the first DUT sequence and transmission by the tester of a trigger signal 403bb to the trigger control source 402c informing it of its completion of such capture. The trigger control source 402c may then pass this information on as an appropriate trigger signal 403cc to the test control management 402d, which may then begin preparing for the next DUT signal sequence.

The DUT may then send a trigger signal 403ab to the test control management 402d to confirm that it has completed its sequence (the completion of which may be already expected by the test control management 402d based on its own preparation). Based on this confirmation, the test control management 402d may initiate programming the next DUT sequence (e.g., while avoiding any overwriting of the current DUT sequence). Accordingly, such confirmation signal 403ab from the DUT may be optional, e.g., since the test control management 402d may know the duration of the DUT sequence and, therefore, keep track of independent of a confirmation signal 403ab from the DUT (e.g., as may be possible when the DUT sequence has a known duration). As an additional option, the test control management 402d may overwrite the current DUT sequence (e.g., during execution by overwriting earlier portions as later portions continue to be executed). The test control management 402d may then initiate, via a trigger signal 403dc, preparation and/or programming of the next DUT sequence.

A third portion 405c of a test sequence may include a series of communications, e.g., beginning with a trigger signal 403ac from the DUT, indicating its readiness, to the test control management 402d. The test control management 402d may then activate the next step by sending a trigger signal 403dd to the trigger control source 402c, which, in turn, sends a trigger signal 403cd on to the tester 402b. (Alternatively, if DUT programming proceeds quickly and the DUT 402a is triggered by a trigger signal (not shown), initiation of transmissions by the DUT 402a may begin sooner so long as such transmissions do not begin until preparation of the DUT 402a is complete.) Then, the test control management 402d may send a trigger signal 403de to the DUT 402a to initiate its sequence.

A fourth portion 405d of a test sequence may include a series of communications, e.g., initiated following an interval in which the tester 402b is transmitting (e.g., with its VSG) more data packets than required by the DUT 402a. (Alternatively, the DUT 402a may send a trigger signal (not shown) to indicate that it has completed its operations before or after the VSG is finished.) The tester 402b may then send a trigger signal 403bc, indicating completion of its sequence operations (e.g., by its VSG), to the trigger control source 402c, which may be forwarded by a related trigger signal 403ce to the test control management 402d. In turn, the test control management 402d may then send a trigger signal 403df to initiate preparation(s) of the DUT 402a.

If the next test sequence (or a remaining portion of the current test sequence) requires the tester 402b to be transmitting data packets prior to completion of preparation(s) of and initiation of operations by the DUT 402a (e.g., to enable synchronization of the DUT 402a to the signal transmissions of the tester 402b), the test control management 402d may initiate transmissions by the tester 402b via a trigger signal 403dg sent to the trigger control source 402c, which, in turn, may send a related trigger signal 403cf to the tester 402b. (Alternatively, this may also be initiated after a DUT ready signal 403ad is sent by the DUT 402a coming back from DUT so long as the tester 402b has transmitted a sufficient number of data packets and/or for a sufficient time interval.)

A fifth portion 405e of a test sequence may begin with a communication in the form of a trigger signal 403ad from the DUT 402*a* indicating its readiness to begin synchronizing with data packet transmissions from the tester 402*b*. Accordingly, there may be no need for a separate start signal. (Alternatively, the test control management 402*d* may send a trigger signal (not shown) to initiate a signal searching operation by the DUT 402*a* to find and synchronize with data packet transmissions from the tester 402*b*, in which case data packet transmissions from the tester (VSG) 402*b* would need to have been initiated prior to such trigger signal.)

A sixth portion 405*f* of a test sequence (e.g., similar to the second portion as discussed above) may begin after the tester 402*b* has completed capturing data packets (e.g., with its VSA) from the DUT 402*a*. A trigger signal 403*bd* indicating capture completion may be sent by the tester 402*b* to the trigger control source 402*c*, which, in turn may send a related trigger signal 403*cg* to the test control management 402*d*. (Alternatively, one could also rely on a DUT signal (not shown) indicating it has completed its operations, or the test control management 402*d* knowing the duration of the sequence, e.g., for sequences having durations known a priori.) The DUT 402*a* may then send a trigger signal 403*ae* to the test control management 402*d* indicating it has completed its operations.

Also, though not presented here, it will be appreciated by those skilled in the art that, as one or more post processing steps, the test control management 402*d* may also be responsible for preparing and/or presenting data to a user, which will often be delayed relative to the signal timing depicted here to allow sufficient time for necessary calculations.

Figure 5:
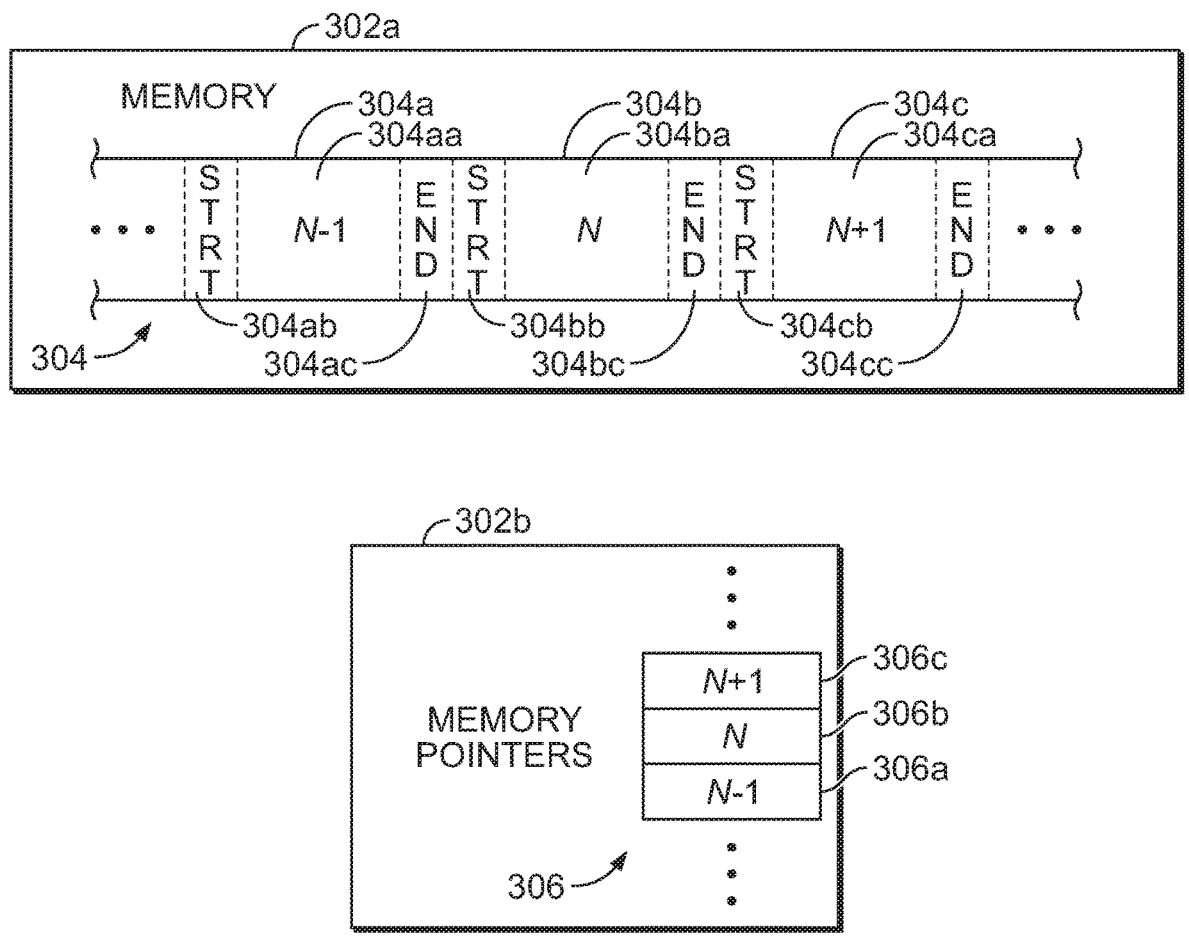
FIG. 5 depicts multiple stored subs-sequences of a test flow and corresponding memory pointers in accordance with example embodiments.

Referring to FIG. 5, multiple subs-sequences of a test flow and corresponding memory pointers in accordance with example embodiments may be stored and interact as described herein. For example, one or more storage elements (e.g., memory) 302*a* may store sub-sequences of test operations (as discussed herein) . . . , 304*a*, 304*b*, 304*c*, . . . which have been combined (e.g., concatenated) into a single sequence. Each sub-sequence may include a beginning, or start, operation . . . , 304*ab*, 304*bb*, 304*cb*, . . . , which may be initiated by a trigger signal to begin execution of its corresponding sub-sequence operations . . . , 304*aa*, 304*ba*, 304*ca*, . . . . Following completion of the sub-sequence operations . . . , 304*aa*, 304*ba*, 304*ca*, . . . , corresponding ending operations . . . , 304*ac*, 304*bc*, 304*cc*, . . . are executed to effectively pause continued execution of the overall sequence 304 by ending (e.g., self-terminating) execution of the corresponding sub-sequence operations . . . , 304*aa*, 304*ba*, 304*ca*, . . . . Successive ones of these sub-sequences of test operations . . . , 304*a*, 304*b*, 304*c*, . . . may be stored sequentially to enable simple stepping from one sub-sequence to the next as each is triggered to initiate its execution (as discussed herein).

The trigger signal may be in the form of an internally generated trigger produced as part of the previously combined and stored sub-sequences of test operations. For example, the end of the DUT operation and timing of corresponding analyses should be known. Accordingly, outgoing trigger events may be embedded as part of the executions of the sub-sequences, which occur in a linear and sequential manner (e.g., in an order that may be deterministic).

Alternatively, it may be desirable or perhaps necessary under some conditions to store the sub-sequences . . . , 304*a*, 304*b*, 304*c*, . . . non-sequentially. In such cases additional memory may be used to store a sequence 306 of memory pointers . . . , 306*a*, 306*b*, 306*c*, . . . to identify respective ones of the non-sequentially stored sub-sequences . . . , 304*a*, 304*b*, 304*c*, . . . . For example, the sequence 306 of memory pointers may be stored such that the respective memory pointers . . . , 306*a*, 306*b*, 306*c*, . . . are effectively concatenated and thereby, again, enable a simple stepping from one sub-sequence to the next as each is triggered to initiate its execution.

Figure 6:
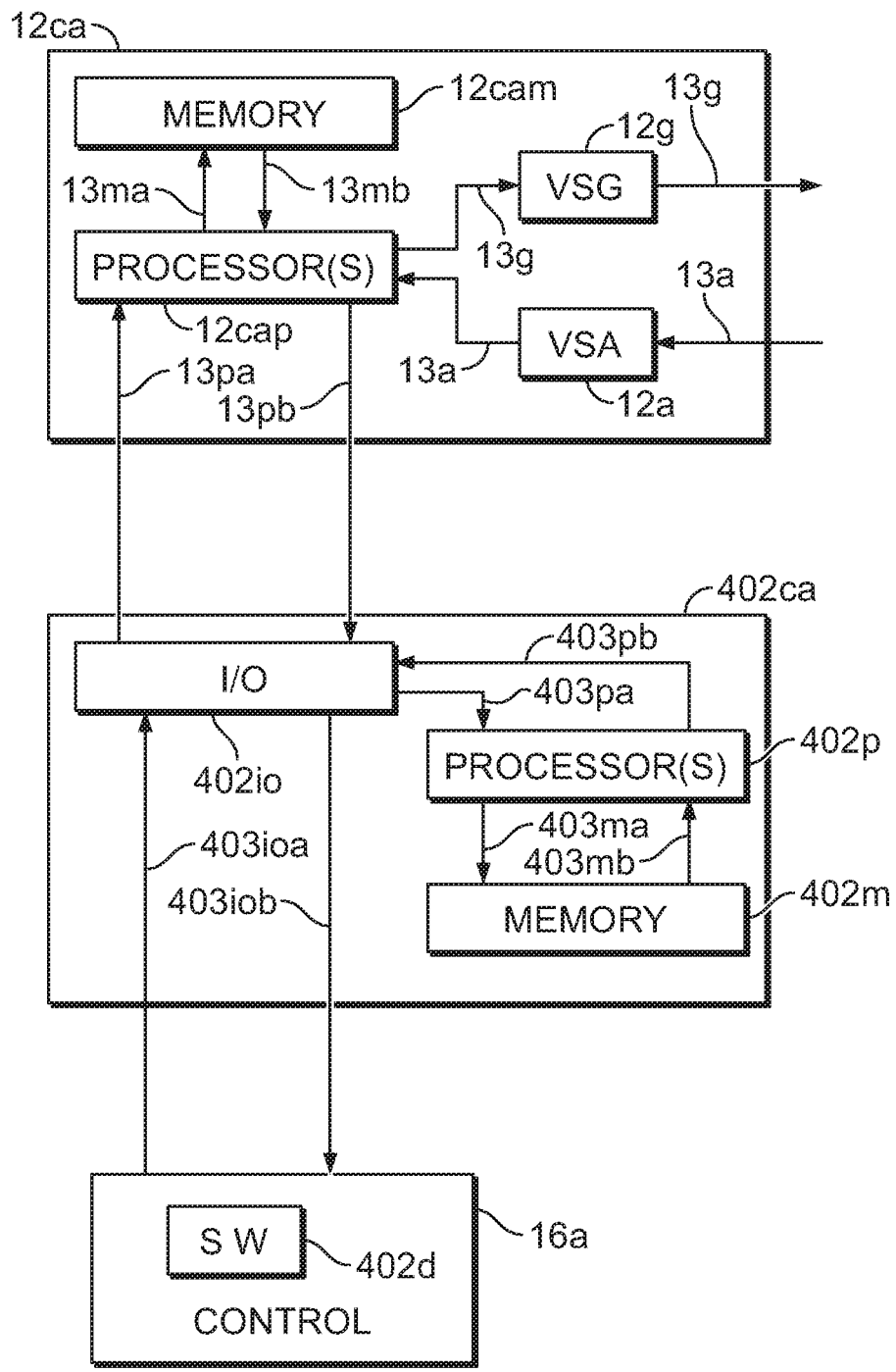
FIG. 6 depicts processing and storage elements of a tester, trigger control source and test control management in accordance with example embodiments.

Referring to FIG. 6, processing and storage elements of a tester 402*b*, trigger control source 402*c* and test control management 402*d* in accordance with example embodiments may communicate as shown to interact as described herein. For example, the tester 402*b* may be implemented as a tester 12*ca* with sub-systems similar to those of the tester of FIG. 2, such as a VSG 12*g* and VSA 12*a*, plus one or more processors 12*cap* and memory 12*cam*. The processor(s) 12*cap* and memory 12*cam* may exchange data and/or instructions via one or more signal lines 13*ma*, 13*mb* (e.g., separate unidirectional or bidirectional bus lines). Similarly, the processor(s) 12*cap* may send outgoing data to the VSG 12*g* and receive incoming data from the VSA 12*a* via corresponding signal lines 13*g*, 13*a*. The processor(s) 12*cap* may exchange incoming and outgoing trigger signals with the trigger control source 402*c* via corresponding signal lines 13*pa*, 13*pb* as described herein.

The trigger control source 402*ca* may be implemented as a board computer with one or more processors 402*p*, memory 402*m* and input/output (I/O) circuitry (e.g., GPIO) as described herein. The processor(s) 402*p* and memory 402*m* may exchange data and/or instructions via one or more signal lines 403*ma*, 403*mb* (e.g., separate unidirectional or bidirectional bus lines). The processor(s) 402*p* and I/O circuitry may exchange incoming and outgoing trigger signals with the tester 12*ca* via corresponding signal lines 403*pa*, 403*pb* as described herein.

The test control management 402*d* may be implemented as software (SW) 402*d* resident and running in a PC 16*a* to exchange incoming and outgoing trigger signals with the trigger control source 402*ca* via corresponding signal lines 403*ioa*, 403*iob* as described herein.

As will be evident from the foregoing discussion, at least one advantage of the system(s) and method(s) disclosed herein includes preprogramming the tester and thereby minimize concerns of a user to be about controlling the DUT during changes between the various test parameters, metrics, features and/or characteristics (e.g., test items such as signal channels and/or bands, nominal signal frequencies, power levels, and/or signal modulation techniques).

For example, in conventional system(s) and method(s), programming of the DUT and tester are performed sequentially. Depending on programming and/or operating characteristics of the DUT, the tester may be programmed before or after DUT programming is completed, (e.g., if a test sequence is triggered by the DUT starting its operation, it may be necessary to program the tester before the DUT begins operating. Similarly, if the DUT requires a signal from the tester to start its operation, it may be necessary to program the tester after the DUT is ready. Accordingly, by adhering to such timing of the respective programming and operating requirements on the parts of the tester and DUT, will ensure that one (of the tester and DUT) does not begin operating prior to the other being ready. This leads to sequential programming of the tester and DUT, which necessarily increases the overall test time. In a sequence-based test, this may easily increase test time for a typical cellular device with long test sequences by 15-20% of the total test time. Worse yet, for shorter test sequences, this percentage increases even more significantly.

Hence, conventional system(s) and method(s) rely upon a dedicated sequence for each sub-test group. Often this is because the tester is unable to change test technology during or within a test sequence. As noted, preparation and loading of each sequence increases the test time. For example, in a SPT test mode with a highly optimized sequence, preparation and loading of the sequence loading may be up to 40% of the total test time (e.g., 40% preparation and 60% execution). Meanwhile, time for DUT control is significantly smaller by comparison. In any event, while other types of testers may be faster at preparing sequences, it will nonetheless take more time.

Other conventional system(s) and method(s) may use test sequences initiated by a DUT signal transmission (also referred to as TX-triggered, or DUT initiated, test) in which the DUT initiates the test sequence. However, tester operations will generally be faster than those of the DUT, so TX activity on the part of the DUT (e.g., self-calibration and/or data packet gaps after the last capture in the previous sequence) must be avoided to prevent the DUT from prematurely triggering the tester to move on to the next portion of the test sequence.

Accordingly, the system(s) and method(s) disclosed herein advantageously minimize required test time associated with the tester by programming the test flow into a single sequence prior to initiating test operations. This advantageously enables the tester to be programmed in parallel with the DUT and only needing a single synchronization before starting test operations. This also advantageously minimizes, and often eliminates, time required by the tester between the various test parameters, metrics, features and/or characteristics (e.g., test items such as signal channels and/or bands, nominal signal frequencies, power levels, and/or signal modulation techniques).

Further, the system(s) and method(s) disclosed herein advantageously include introducing a technique for effectively pausing the tester sequence between test sequences or steps to be performed by the DUT (e.g., the may DUT remain operative with its predetermined or existing behavior, which may include many sequences in a test flow). Instead, the tester may be controlled through hardware (HW) signals to/from a controlling computer (e.g, a board computer such as a RaspberryPi™). For example, as discussed above, the tester may send HW signals to external software (SW) running on a separate controller (e.g., a personal computer) informing the external SW that it (the tester) has completed a sub-sequence targeted for a given DUT sequence or sub-sequence (e.g., the VSG has finished its transmissions and/or the VSA has finished its data packet captures). As a result, the external SW becomes aware that it may continue updating the DUT (e.g., when the DUT call is non-blocking). Similarly, when the DUT is ready for its next operation (e.g., the next DUT signal sequence) a HW signal may be sent to the tester to continue the overall test sequence (e.g., by waiting for a data packet transmission from the DUT or send out a HW trigger signal to start the DUT).

This enables reduced test time in that times between successive DUT test sequences are limited to control by the DUT. Further, test time may be further reduced for non-blocking DUT calls since it may be known a priori when the DUT will have completed its operation(s) without a need to query it.

While tester sequence compilation time may increase with programmed sequences becoming longer, any additional compilation time will have minimal effect, since it will take place when the tester is not busy (e.g., no ongoing test data calculations), and such time will be non-critical when coincident with booting of the DUT. Further, with use of a single test sequence as described herein, such programmed sequence may be cached to avoid additional or similar compilation time later. Instead, the compiled sequence may simply retrieved from cache and repeated. Even if the sequence cannot be cached, the longer sequence may be prepared before DUT testing begins (e.g., while the DUT is booting), which is effectively lost time anyway. Further, even if the tester may not yet be loaded at this point in time (e.g., unless APT is performed across modules), preparations should nonetheless be faster.

The system(s) and method(s) disclosed herein advantageously combine (e.g., concatenate) smaller sequences into a single larger sequence that may be started and stopped (e.g., paused) under control of external signals. Multiple such external signals may be used to trigger and/or otherwise control initiation and pausing testing sub-sequences, e.g., instead of requiring the tester to initiate a sequence or trigger on a data packet coming from the DUT to acquire time alignment. Such use of external triggers would, otherwise, require real-time synchronized control. In contrast thereto, system(s) and method(s) disclosed herein combine (e.g., concatenate) sequences and enable them one by one by input/output (TO) signals applied between the combined sequences.

Such use of IO trigger signals to trigger the sequence may be specific to the tester and, as such, may be implemented or otherwise controlled by software. However, that would introduce timing variations due to latency in the software itself (e.g., due to loading on the central processing unit (CPU) of the tester, etc.) Instead, using trigger signals in the form of GPIO signals results in virtually instantaneous transmission and reception of the triggers as they bypass the tester software and communicate directly to the hardware (e.g., a FPGA).

Further test time reduction may be realized by loading (e.g., programming) the tester and DUT sequences simultaneously, which is enabled by the system(s) and method(s) disclosed herein, in which initiation of the tester sequence may be controllably delayed as desired or needed to ensure the tester and DUT are both ready to begin their respective testing operations as prescribed in their respective sequences.

System(s) and method(s) as disclosed herein that use a trigger control source in the form of a board computer (e.g., a RaspberryPi™) advantageously make use of dedicated GPIO ports via which interrupt signals may be sent and received virtually instantaneously. Such an interrupt signal interface is not available in a standard PC environment, and it often causes delays if an external card is used in or with the PC.

As a further alternative, a board computer may be used to control all aspects of the test flow, thereby avoiding use of a PC for overall control. Currently, typical DUTs include drivers for interfacing with a PC, so PC drivers would need to be ported to the board computer, in which case all required elements would resident, i.e., PC drivers and GPIO ports.

Various other modifications and alternatives in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. A system for testing a radio frequency (RF) data packet transceiver device under test (DUT), comprising:
 a plurality of control signal ports;
 a controller coupled to said plurality of control signal ports and operative to initiate respective ones of a plurality of test control sequences, wherein
  each of said plurality of test control sequences includes a respective beginning operation and a respective ending operation,
  each beginning operation is initiated by an input signal received via a first port of said plurality of control signal ports from an external device,
  each ending operation initiates an output signal provided for said external device via a second port of said plurality of control signal ports, and
  said controller executes a beginning operation of one of said plurality of test control sequences following said input signal received via said first port after an ending operation of a preceding one of said plurality of test control sequences;
 a RF data packet transmitter coupled to said controller and responsive to one or more portions of said plurality of test control sequences by transmitting one or more RF data packet signals for reception by a DUT; and
 a RF data packet receiver coupled to said controller and responsive to one or more portions of said plurality of test control sequences by receiving one or more RF data packet signals provided by said DUT.

2. The system of claim 1, wherein said plurality of control signal ports are controllable by one or more portions of the plurality of test control sequences.

3. The system of claim 1, wherein said controller comprises:
 one or more processors; and
 a first memory portion coupled to said one or more processors and containing a plurality of instructions defining said plurality of test control sequences.

4. The system of claim 3, wherein said plurality of instructions define a plurality of concatenated test control sequences as said plurality of test control sequences.

5. The system of claim 3, wherein said plurality of instructions define a plurality of sequential test control sequences as said plurality of test control sequences.

6. The system of claim 3, wherein:
 said controller further comprises a second memory portion containing a plurality of memory pointers; and
 each one of said plurality of memory pointers corresponds to a respective one of said plurality of test control sequences.

7. The system of claim 6, wherein said plurality of test control sequences comprises a plurality of concatenated test control sequences.

8. The system of claim 6, wherein said plurality of test control sequences comprises a plurality of sequential test control sequences.

9. A computing device for controlling a tester during testing of a radio frequency (RF) data packet transceiver device under test (DUT), comprising:
 one or more output signal ports for providing one or more output control signals for reception by a tester or a DUT;
 one or more input signal ports for receiving one or more input control signals provided by said tester or said DUT;
 one or more processors coupled to said one or more output signal ports and said one or more input signal ports; and
 a first memory portion coupled to said one or more processors and containing a plurality of instructions that when executed cause said one or more processors to
  generate one of said one or more output control signals to initiate, by said tester, a first beginning operation of a first one of a plurality of test control sequences,
  respond to one of said one or more input control signals by generating another first control signal to initiate, by said tester, a second beginning operation of a second one of said plurality of test control sequences,
  generate another of said one or more output control signals to initiate, by said DUT during at least a portion of said first one of a plurality of test control sequences, transmission of a first one or more outgoing RF data packet signals and reception of a first one or more incoming RF data packet signals, and
  respond to another of said one or more input control signals by generating another third control signal to initiate, by said DUT, during at least a portion of said second one of a plurality of test control sequences, transmission of a second one or more outgoing RF data packet signals and reception of a second one or more incoming RF data packet signals.

10. A method for testing a radio frequency (RF) data packet transceiver device under test (DUT), comprising:
 receiving an input signal via a first one of a plurality of control signal ports;
 providing an output signal via a second one of said plurality of control signal ports;
 initiating respective ones of a plurality of test control sequences, wherein
  each of said plurality of test control sequences includes a respective beginning operation and a respective ending operation,
  each beginning operation is initiated by said input signal, and
  a beginning operation of one of said plurality of test control sequences is executed following said input signal received via said first one of said plurality of control signal ports after an ending operation of a preceding one of said plurality of test control sequences;
 responding to one or more portions of said plurality of test control sequences by transmitting one or more RF data packet signals for reception by a DUT; and
 responding to one or more portions of said plurality of test control sequences by receiving one or more RF data packet signals provided by said DUT.

11. The method of claim 10, wherein each ending operation initiates said output signal.

12. The method of claim 10, further comprising controlling said first and second ones of said plurality of control signal ports by one or more portions of the plurality of test control sequences.

13. The method of claim 10, wherein said initiating respective ones of a plurality of test control sequences comprises:
 accessing a plurality of instructions defining said plurality of test control sequences stored in a first memory portion; and executing, with one or more processors, said accessed plurality of instructions.

14. The method of claim 13, wherein said plurality of instructions define a plurality of concatenated test control sequences as said plurality of test control sequences.

15. The method of claim 13, wherein said plurality of instructions define a plurality of sequential test control sequences as said plurality of test control sequences.

16. The method of claim 13, further comprising accessing a plurality of memory pointers stored in a second memory portion, wherein:
   each one of said plurality of memory pointers corresponds to a respective one of said plurality of test control sequences; and
   said accessing a plurality of instructions defining said plurality of test control sequences stored in a first memory portion comprises accessing said plurality of instructions in accordance with said corresponding ones of said plurality of memory pointers.

17. The method of claim 16, wherein said plurality of test control sequences comprises a plurality of concatenated test control sequences.

18. The method of claim 16, wherein said plurality of test control sequences comprises a plurality of sequential test control sequences.

* * * * *